(12) United States Patent
Hsiao et al.

(10) Patent No.: US 9,607,936 B2
(45) Date of Patent: Mar. 28, 2017

(54) COPPER BUMP JOINT STRUCTURES WITH IMPROVED CRACK RESISTANCE

(75) Inventors: Ching-Wen Hsiao, Banqiao (TW); Jiun Yi Wu, Taoyuan County (TW); Ru-Ying Huang, Taipei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1323 days.

(21) Appl. No.: 12/619,468

(22) Filed: Nov. 16, 2009

(65) Prior Publication Data

US 2011/0101526 A1 May 5, 2011

Related U.S. Application Data

(60) Provisional application No. 61/256,090, filed on Oct. 29, 2009.

(51) Int. Cl.
*H01L 23/488* (2006.01)
*H01L 23/498* (2006.01)
(Continued)

(52) U.S. Cl.
CPC .. *H01L 23/49816* (2013.01); *H01L 23/49827* (2013.01); *H01L 24/16* (2013.01); *H01L 24/81* (2013.01); *H05K 3/3463* (2013.01); *H01L 24/05* (2013.01); *H01L 24/13* (2013.01); *H01L 2224/0401* (2013.01); *H01L 2224/1146* (2013.01); *H01L 2224/1147* (2013.01); *H01L 2224/1308* (2013.01); *H01L 2224/13083* (2013.01); *H01L 2224/13084* (2013.01); *H01L 2224/13111* (2013.01); *H01L 2224/13116* (2013.01); *H01L 2224/13147* (2013.01); *H01L 2224/13155* (2013.01); *H01L 2224/13164* (2013.01); *H01L 2224/81191* (2013.01);
(Continued)

(58) Field of Classification Search
CPC . H01L 2224/13083; H01L 2224/13084; H01L 2224/13155; H01L 2224/13164; H01L 23/49816; H01L 24/13; H01L 24/16
USPC .......................... 257/738, 778, 781, E23.028
See application file for complete search history.

(56) References Cited

U.S. PATENT DOCUMENTS 6,218,281 B1 4/2001 Watanabe et al.
6,229,220 B1 5/2001 Saitoh et al.
(Continued)

FOREIGN PATENT DOCUMENTS

JP 5335313 A 12/1993
JP 2000228420 A 8/2000
(Continued)

OTHER PUBLICATIONS

Korean Office Action regarding Korean Patent Application No. 10-2010-0096044, dated Sep. 28, 2012, 10 pages.

*Primary Examiner* — Marcos D Pizarro
(74) *Attorney, Agent, or Firm* — Slater Matsil, LLP

(57) ABSTRACT

An integrated circuit structure includes a first work piece and a second work piece. The first work piece includes a semiconductor substrate, and a copper bump over the semiconductor substrate. The second work piece includes a bond pad. A solder is between and adjoining the first work piece and the second work piece, wherein the solder electrically connects the copper bump to the bond pad. The solder includes palladium.

11 Claims, 4 Drawing Sheets

(51) Int. Cl.
    *H01L 23/00*        (2006.01)
    *H05K 3/34*         (2006.01)

(52) U.S. Cl.
    CPC ......... *H01L 2224/81193* (2013.01); *H01L
        2224/81801* (2013.01); *H01L 2924/00013*
        (2013.01); *H01L 2924/014* (2013.01); *H01L
        2924/0105* (2013.01); *H01L 2924/01006*
        (2013.01); *H01L 2924/01013* (2013.01); *H01L
        2924/01019* (2013.01); *H01L 2924/01022*
        (2013.01); *H01L 2924/01023* (2013.01); *H01L
        2924/01029* (2013.01); *H01L 2924/01033*
        (2013.01); *H01L 2924/01046* (2013.01); *H01L
        2924/01047* (2013.01); *H01L 2924/01074*
        (2013.01); *H01L 2924/01078* (2013.01); *H01L
        2924/01079* (2013.01); *H01L 2924/01082*
        (2013.01); *H01L 2924/01322* (2013.01); *H01L
        2924/01327* (2013.01); *H01L 2924/14*
        (2013.01); *H05K 3/3436* (2013.01)

(56) References Cited

U.S. PATENT DOCUMENTS

| | | | |
|---|---|---|---|
| 6,399,475 B1 * | 6/2002 | Petit | 438/614 |
| 6,462,427 B2 * | 10/2002 | Sakiyama et al. | 257/786 |
| 6,462,467 B1 | 10/2002 | Russ | |
| 6,578,754 B1 | 6/2003 | Tung | |
| 6,592,019 B2 | 7/2003 | Tung | |
| 6,614,113 B2 * | 9/2003 | Watanabe et al. | 257/750 |
| 6,818,545 B2 | 11/2004 | Lee et al. | |
| 6,853,076 B2 | 2/2005 | Datta et al. | |
| 6,917,119 B2 | 7/2005 | Lee et al. | |
| 7,064,436 B2 | 6/2006 | Ishiguri et al. | |
| 7,361,990 B2 * | 4/2008 | Lu et al. | 257/738 |
| 7,391,112 B2 | 6/2008 | Li et al. | |
| 7,911,048 B2 * | 3/2011 | Murayama | 257/693 |
| 7,939,939 B1 * | 5/2011 | Zeng et al. | 257/737 |
| 2005/0151268 A1 * | 7/2005 | Boyd et al. | 257/778 |
| 2008/0142994 A1 | 6/2008 | Lu et al. | |
| 2008/0296764 A1 | 12/2008 | Chang et al. | |
| 2009/0011543 A1 | 1/2009 | Karta et al. | |
| 2009/0026608 A1 | 1/2009 | Tsai et al. | |
| 2009/0090543 A1 | 4/2009 | Furuyama et al. | |
| 2009/0130840 A1 | 5/2009 | Wang et al. | |
| 2009/0146303 A1 | 6/2009 | Kwon | |

FOREIGN PATENT DOCUMENTS

| | | |
|---|---|---|
| JP | 2006261641 A | 9/2006 |
| KR | 10-1999-0059688 A | 7/1999 |
| KR | 2009-0035425 A | 4/2009 |

* cited by examiner

COPPER BUMP JOINT STRUCTURES WITH IMPROVED CRACK RESISTANCE

This application claims the benefit of U.S. Provisional Application No. 61/256,090 filed on Oct. 29, 2009, entitled "Copper Bump Joint Structures with Improved Crack Resistance," which application is hereby incorporated herein by reference.

TECHNICAL FIELD

This disclosure relates generally to integrated circuits, and more particularly to flip-chip bond structures and methods for forming the same.

BACKGROUND

In the formation of semiconductor chips, integrated circuit devices such as transistors are first formed at the surfaces of semiconductor substrates in the semiconductor chips. Interconnect structures are then formed over the integrated circuit devices. Bumps are formed on the surfaces of the semiconductor chips, so that the integrated circuit devices can be accessed.

In the packaging of the semiconductor chips, the semiconductor chips are often bonded with package substrates using flip-chip bonding. Solders are used to join the bumps in the semiconductor chips to bond pads in the package substrates. Conventionally, eutectic solder materials containing lead (Pb) and tin (Sn) were used for bonding the bumps. For example, a commonly used lead-containing eutectic solder has about 63% tin (Sn) and 37% lead (Pb). This combination gives the solder material a suitable melting point and low electrical resistivity. Further, the eutectic solders have good crack-resistance.

Lead is a toxic material, and hence legislation and industry requirements have demanded lead-free solder bumps. Solutions to replace lead-containing solders with lead-free solders are thus explored. However, the commonly known lead-free solders such as SnAg, SnAgCu, and their intermetallic components are too brittle, and hence suffering from the crack problem. As a result, the solder joints formed of lead-free solders are often not reliable, and cannot pass the reliability test such as thermal cycles.

Solder cracking is typically caused by stress. The coefficient of thermal expansion (CTE) mismatch between materials in the package assemblies is one of the main reasons causing the stress. For example, silicon substrates typically have CTEs equal to about 3 ppm/° C., low-k dielectric materials may have CTEs equal to about 20 ppm/° C., while the package substrates may have CTEs equal to about 17 ppm/° C. The significant difference in CTEs results in stress being applied to the structure when thermal change occurs. The use of copper in bumps further worsens the problem. Since copper is rigid, a high stress may be applied on the solders adjoining the copper bumps, and hence the solders are more prone to cracking.

SUMMARY

In accordance with one aspect of the embodiment, an integrated circuit structure includes a first work piece and a second work piece. The first work piece includes a semiconductor substrate, and a copper bump over the semiconductor substrate. The second work piece includes a bond pad. A solder is between and adjoining the first work piece and the second work piece, wherein the solder electrically connects the copper bump to the bond pad. The solder includes palladium.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

A novel integrated circuit formation process is provided in accordance with an embodiment. The intermediate stages of manufacturing an embodiment are illustrated. The variations of the embodiment are discussed. Throughout the various views and illustrative embodiments, like reference numbers are used to designate like elements.

Figure 1A:
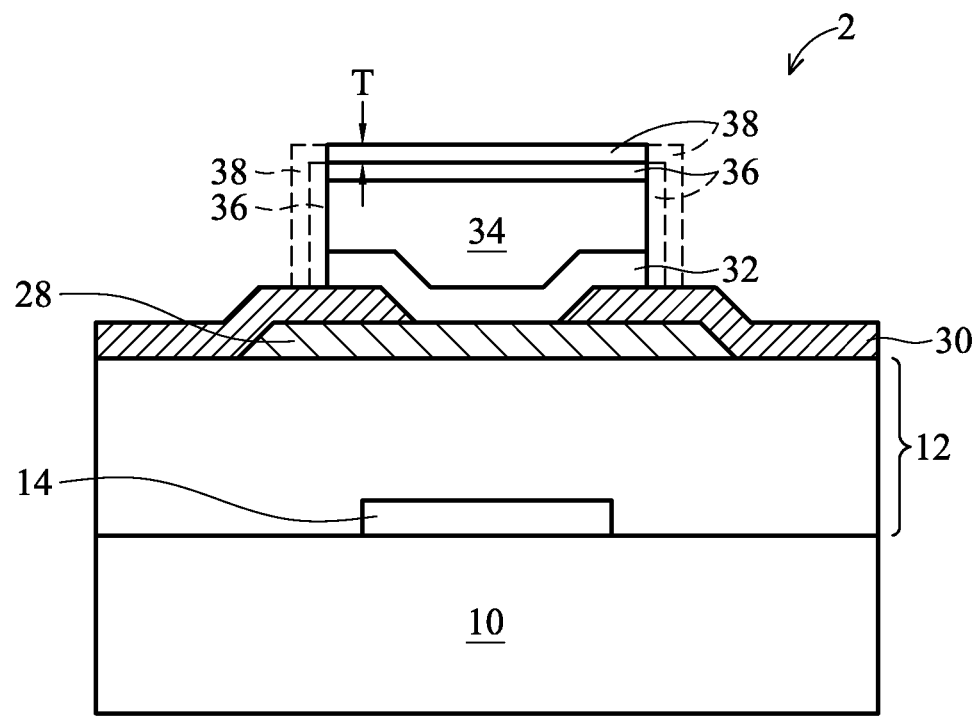
FIG. 1A illustrates a semiconductor chip comprising a copper bump and a palladium layer over the copper bump.

Referring to FIG. 1A, work piece 2, which may be semiconductor chip 2 that includes substrate 10, is provided. Throughout the description, work piece 2 is alternatively referred to as chip 2, although it may also be a package substrate or an interposer substrate. In an embodiment, substrate 10 is a semiconductor substrate such as a bulk silicon substrate, although it may include other semiconductor materials such as group III, group IV, and/or group V elements. Semiconductor devices 14 such as transistors may be formed at the surface of substrate 10. Interconnect structure 12, which includes metal lines and vias (not shown) formed therein and connected to semiconductor devices 14, is formed over substrate 10. The metal lines and vias may be formed of copper or copper alloys, and may be formed using the well-known damascene processes. Interconnect structure 12 may include commonly known inter-layer dielectrics (ILDs) and inter-metal dielectrics (IMDs).

Metal pad 28 is formed over interconnect structure 12. Metal pad 28 may comprise aluminum, copper (Cu), silver (Ag), gold (Au), nickel (Ni), tungsten (W), alloys thereof, and/or multi-layers thereof. Metal pad 28 may be electrically connected to semiconductor devices 14, for example, through the underlying interconnection structure 12. Passivation layer 30 may be formed to cover edge portions of metal pad 28. In an exemplary embodiment, passivation layer 30 is formed of polyimide or other known dielectric materials.

Under bump metallurgy (UBM) 32 is formed on, and electrically connected to, metal pad 28. UBM 32 may include a copper layer and a titanium layer (not shown). Copper bump 34 is formed on UBM 32. In an embodiment, copper bump 34 is formed by plating. An exemplary plating process includes forming a mask on the UBM layer, patterning the mask to form an opening, plating copper bump 34 in the opening, and removing the mask and uncovered portion of the UBM layer. The thickness of copper bump 34 may be greater than about 30 μm, or even greater than about 45 μm. Copper bump 34 may be formed of pure copper.

Barrier layer 36 may then be formed on copper bump 34, for example, by plating. Barrier layer 36 may be formed of nickel, although other metals may be added. In an embodiment, palladium layer 38 is formed over barrier layer 36. In alternative embodiments, no barrier layer 36 is formed, and palladium layer 38 contacts copper bump 34. Barrier layer 36 and/or palladium layer 38 may be plated using a same mask (not shown) as the mask in the plating of copper bump 34, and hence barrier layer 36 and/or palladium layer 38 are limited in the region directly over copper bump 34, and are not formed on sidewalls of copper bump 34. In alternative embodiments, barrier layer 36 and/or palladium layer 38 are plated after the removal of the mask that is used for plating copper bump 34. As a result, barrier layer 36 and/or palladium layer 38 are also formed on the sidewalls of copper bump 34, as illustrated using dotted lines.

An exemplary thickness of palladium layer 38 is between about 0.01 μm and about 0.1 μm. In an embodiment, palladium layer 38 is formed of pure palladium, for example, with palladium weight percentage in palladium layer 38 being greater than about 95 percent, or even greater than about 99 percent, or 99.9 percent. As an example, while palladium layer 38 is described as being formed of "pure" palladium, those skilled in the art will recognize that this limitation is intended to cover the impurity unintentionally introduced in the formation process, and the impurities intentionally introduced by process optimization.

Figure 1B:
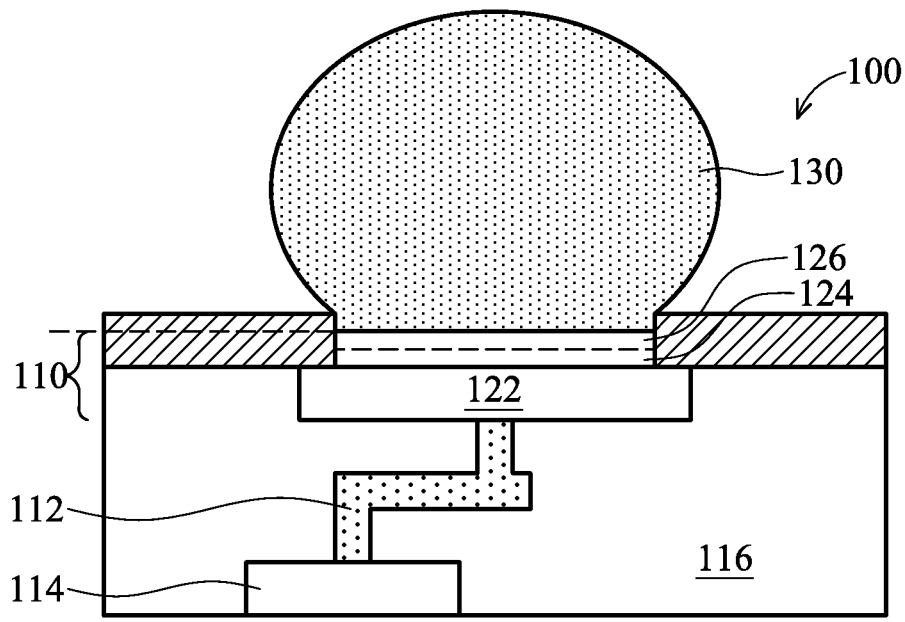
FIG. 1B illustrates a package substrate comprising a bond pad with a solder ball on the bond pad.

FIG. 1B illustrates work piece 100. In an embodiment, work piece 100 is a package substrate (and hence is referred to as package substrate 100 hereinafter), although it may also be a semiconductor chip, an interposer substrate, or the like. Package substrate 100 may include bond pad 110, which is electrically connected to bond pad 114 through metal interconnection 112. Bond pad 114 and bond pad 110 are on opposite sides of package substrate 100. Metal interconnection 112 may be formed in dielectric substrate 116.

Bond pad 110 comprises metal pad 122, which may be a bond pad formed of copper (for example, pure or substantially pure copper), aluminum, silver, and alloys thereof. Barrier layer 124 may then be formed over metal pad 122, for example, by electroless or electro plating. Barrier layer 124 may be formed of nickel, although other metals may be added. In an embodiment, metal pad 110 further comprises palladium layer 126 over barrier layer 124. In alternative embodiments, no barrier layer 124 is formed, and hence palladium layer 126 contacts metal pad 122 directly. The thickness and the materials of palladium layer 126 may be essentially the same as that of palladium layer 38 (FIG. 1A), as discussed in preceding paragraphs.

Solder ball 130 is mounted on palladium layer 126. In an embodiment, solder ball 130 is formed of a lead-free solder material containing, for example, SnAg, SnAgCu, and the like, although solder ball 130 may also be formed of eutectic solder material containing, for example, lead (Pb) and tin (Sn).

Figure 2:
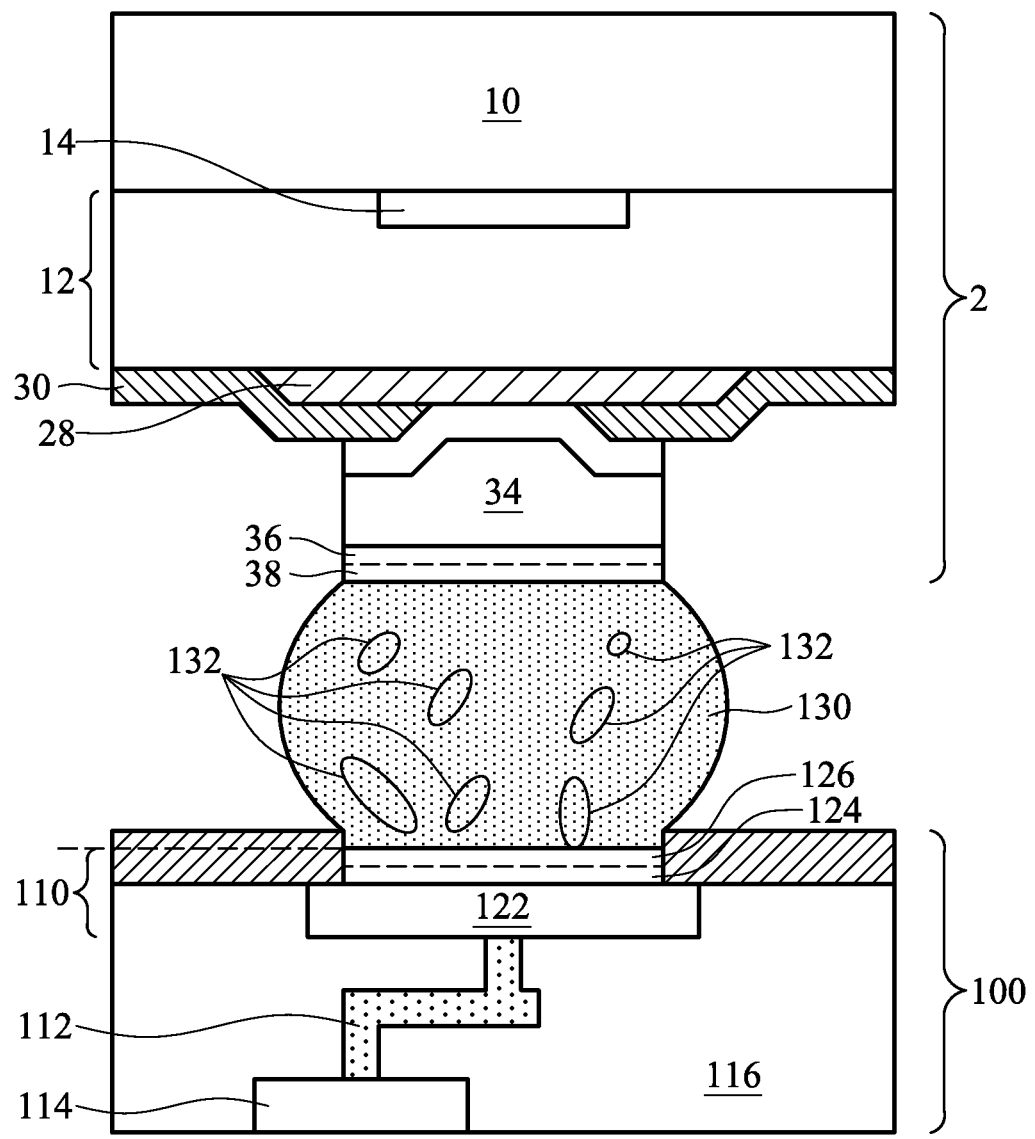
FIG. 2 illustrates the bonding of the structures shown in FIGS. 1A and 1B.

Work piece 2 and work piece 100 may be bonded through flip-chip bonding, as shown in FIG. 2. Solder ball 130 thus joins work piece 2 and work piece 100 together. A reflow process is performed to melt solder ball 130. In an embodiment, the reflow may be performed at a temperature between about 220° C. and about 280° C. The reflow temperature and the reflow duration may be adjusted to optimize the diffusion of palladium in palladium layers 38 and/or 126, so that the resulting reflowed solder ball 130 is more resistive to crack.

After the reflow, due to the diffusion of palladium in palladium layers 38 and 126 into solder ball 130, solder ball 130 may comprise less than about 0.3 weight percent palladium. In an exemplary embodiment, solder ball 130 comprises between about 0.15 weight percent to about 0.3 weight percent palladium on average. However, palladium may be concentrated to form palladium-rich grains, as is schematically illustrated as grains 132. The grains 132 is also referred to as an intermetallic compound (IMC) 132 including copper, nickel, tin, palladium, and/or other metals, and the palladium weight percentage may be between about 5 weight percent to about 10 weight percent, which is significantly greater than the palladium weight percentage outside IMC 132. The grains 132 are also referred to as palladium-rich grains 132. Further, at the interfaces between solder ball 130 and the original palladium layers 38 and 126, remaining portions of each of palladium layers 38 and 126 may (or may not) remain. The remaining portions of palladium layers 38 and 126, if any, will very likely to be alloys of copper, palladium, nickel, and/or the solder materials in solder ball 130, depending on the composition of layers 34, 36, 38, 130, 126, 124, and 122 (refer to FIGS. 1A and 1B). Further, there may be a region in solder ball 130, in which palladium weight percentage gradually drops from the side closer to copper bump 34 (or metal pad 122) toward the center of solder ball 130.

The addition of palladium into solder ball 130 may be achieved from the side of chip 2 and the side of package substrate 100. Accordingly, one of palladium layers 38 and 126 may be optional, although at least one, or both, of palladium layers 38 and 126 needs to be formed. The thickness of the corresponding palladium layers 38 and/or 126 may be determined based on the desirable weight percentage of palladium in solder ball 130 and the amount of solder ball 130, and may be found through experiments.

Figure 3A:
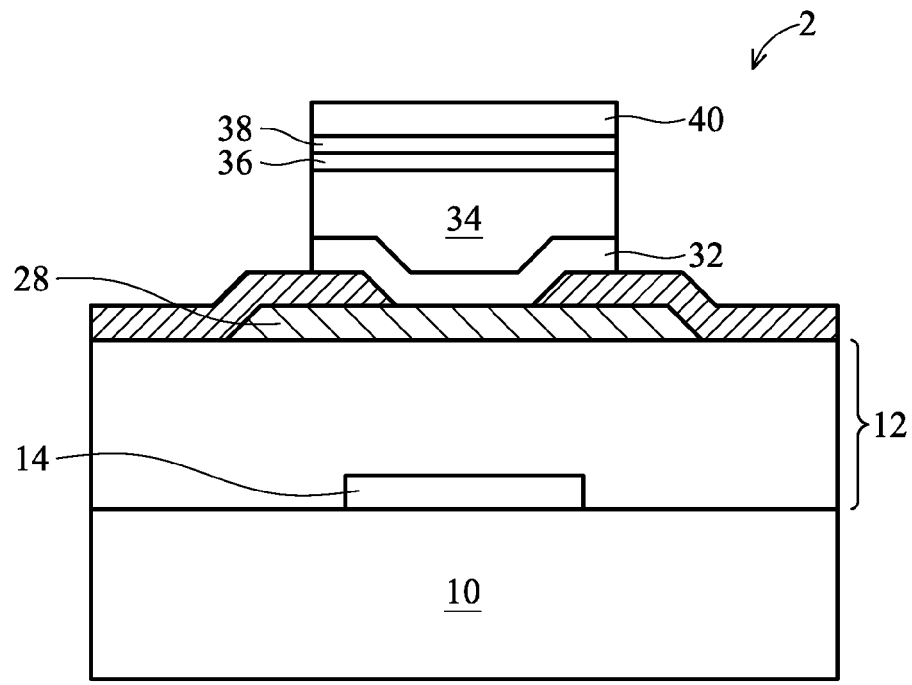
FIG. 3A illustrates a semiconductor chip comprising a copper bump, a palladium layer over the copper bump, and a solder layer over the palladium layer.
Figure 3B:
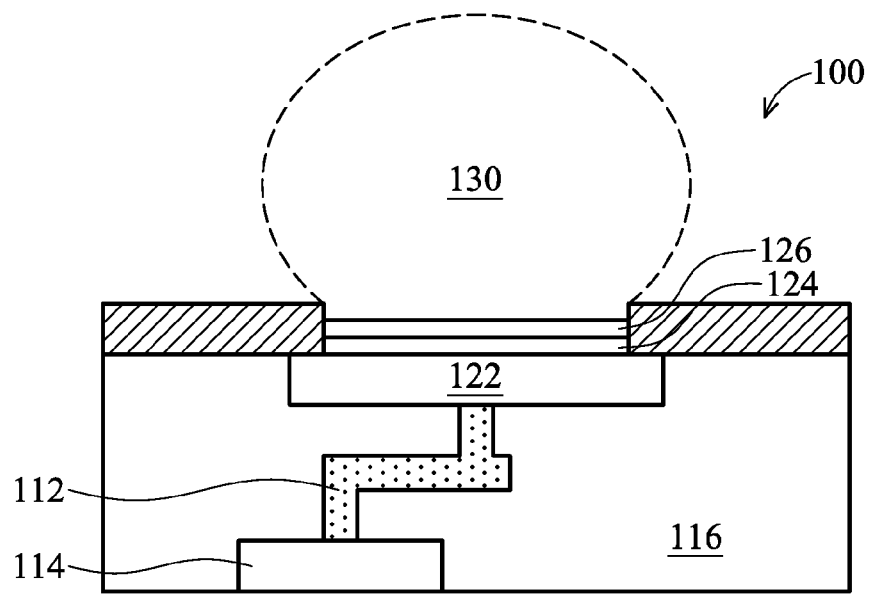
FIG. 3B illustrates a package substrate comprising a bond pad, wherein the solder is optionally formed on the bond pad.

The palladium layer and the solder may be formed on either one of chip 2 and package substrate 100 in any combination, as long as the palladium layer is located close to solder so that palladium can diffuse into it. FIGS. 3A and 3B illustrate an alternative embodiment, wherein solder layer 40 is formed on the side of chip 2, while solder ball 130 on package substrate 100 is optional. In this embodiment, solder layer 40 may be relatively thin, for example, with a thickness less than about 40 μm, and may be formed by plating using a same mask (not shown) as the mask for plating copper bump 34, barrier layer 36, and palladium layer 38. Accordingly, the edges of solder layer 40 may be vertically aligned to the respective edges of copper bump 34. In other words, solder layer 40 may be limited in the region directly over copper bump 34.

Figure 4A:
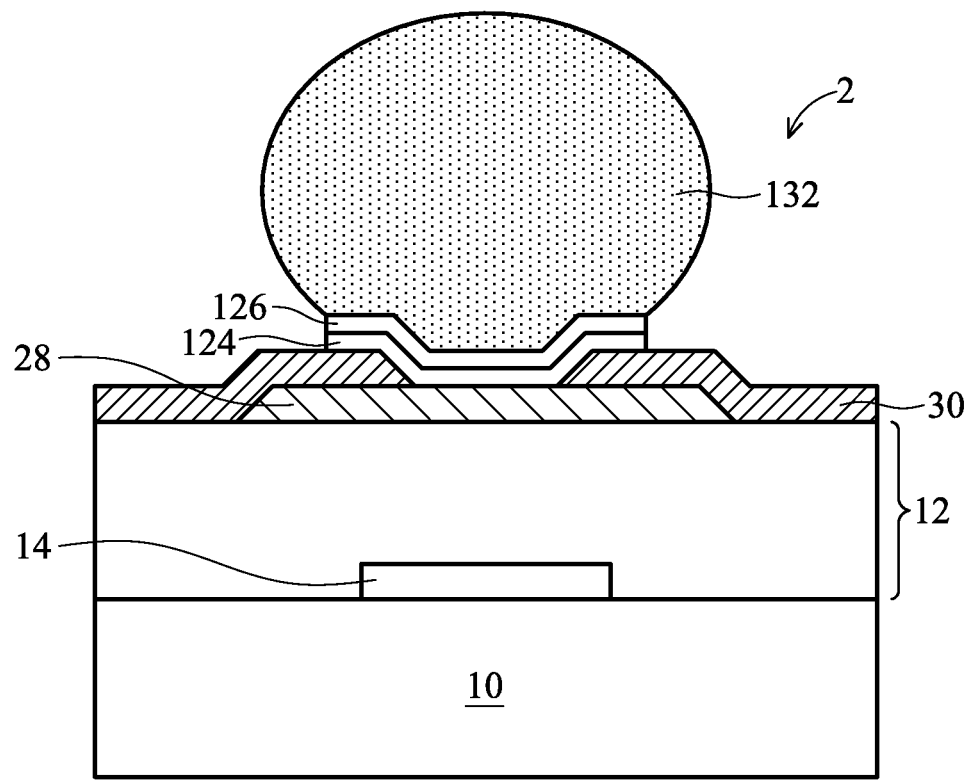
FIG. 4A illustrates a semiconductor chip comprising a bond pad, and a solder ball on the bond pad.
Figure 4B:
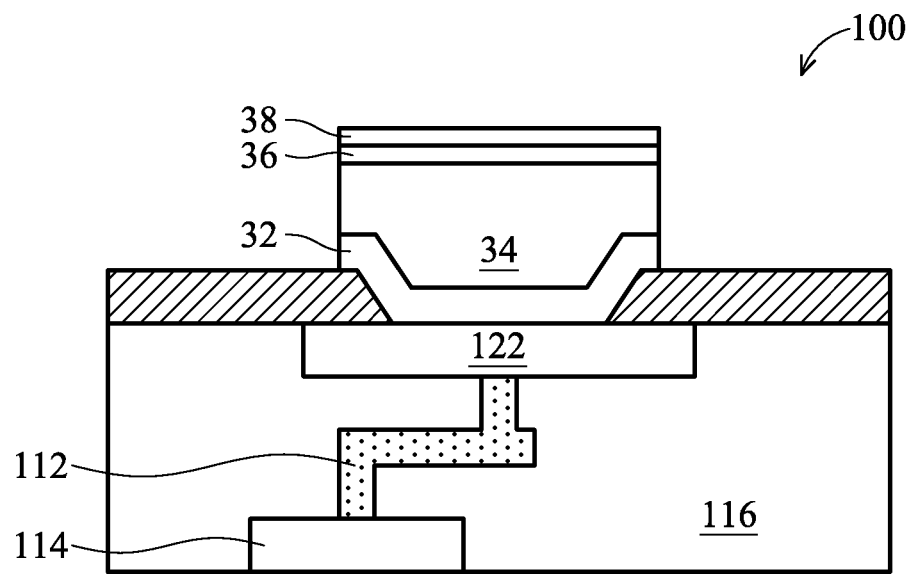
FIG. 4B illustrates a package substrate comprising a copper bump, a palladium layer over the copper bump, and a solder layer over the palladium layer.

FIGS. 4A and 4B illustrate yet another embodiment, wherein copper bump 34, barrier layer 36, and palladium layer 38 are formed on the side of package substrate 100, while barrier layer 124, palladium layer 126 and solder ball 130 are formed on the side of semiconductor chip 2. After the structures as shown in FIGS. 3A/3B or 4A/4B are formed, semiconductor chip 2 and package substrate 100 may be bonded, and one skilled in the art will realize the resulting structure by applying the teaching provided in the preceding paragraphs.

It was observed in the reliability tests that with the diffusion of palladium into solder, the reliability of the resulting solder is significantly improved. The reliability test is performed with thermal cycles performed to stress the structure similar to what is shown in FIG. 2 (with and without palladium layers 38 and 126). It was observed that in a first plurality of samples in which palladium layers 38 and 126 are not formed, cracks with lengths as great as 70 μm to 80 μm were generated after the thermal cycles, while in a second plurality of samples in which palladium layers 38 and 126 are formed, the length of cracks are significantly reduced, with most of the samples having crack lengths less than about 20 μm, and some with crack lengths equal to about 6 μm. The typical crack lengths in the second plurality of samples are only 10 percent to 20 percent the crack lengths in the first plurality of samples.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   a first work piece comprising:
      a semiconductor substrate;
      a copper bump over the semiconductor substrate;
      a barrier layer over the copper bump; and
      an alloy layer over the barrier layer, wherein the alloy layer comprises palladium and a metal selected from the group consisting essentially of copper, nickel, and combinations thereof;
   a second work piece comprising a bond pad; and
   a solder layer between and adjoining the first work piece and the second work piece, wherein the alloy layer is between the barrier layer and the solder layer, with opposite surfaces of the alloy layer contacting the barrier layer and the solder layer, wherein the solder layer electrically connects the copper bump to the bond pad, and the solder layer comprises palladium-rich grains distributed in the solder layer, and wherein the palladium-rich grains are distributed from a surface region of the solder layer to a center of the solder layer, and from the surface region to the center, palladium weight percentages reduce gradually.

2. The integrated circuit structure of claim 1, wherein the palladium-rich grains have a palladium weight percentage between about 5 percent and about 10 percent.

3. The integrated circuit structure of claim 1, wherein an average palladium weight percentage in the solder layer is about 0.15% to about 0.3% percent.

4. The integrated circuit structure of claim 1, wherein the bond pad of the second work piece comprises copper.

5. The integrated circuit structure of claim 1, wherein the palladium-rich grains have first palladium weight percentages, and wherein the palladium-rich grains are surrounded by solder region having palladium weight percentages lower than the first palladium weight percentages.

6. The integrated circuit structure of claim 1, wherein the first work piece is a semiconductor chip comprising integrated circuits, and the second work piece is a package substrate.

7. The integrated circuit structure of claim 1, wherein the first work piece is a package substrate, and the second work piece is a semiconductor chip comprising integrated circuits.

8. The integrated circuit structure of claim 1, wherein the alloy layer comprises copper.

9. The integrated circuit structure of claim 1, wherein the alloy layer comprises nickel.

10. The integrated circuit structure of claim 1, wherein the second work piece comprises a palladium layer between the bond pad and the solder layer.

11. The integrated circuit structure of claim 10, wherein the second work piece comprises a barrier layer between the bond pad and the palladium layer.

* * * * *